United States Patent
Gianvittorio et al.

(10) Patent No.: US 10,200,075 B2
(45) Date of Patent: Feb. 5, 2019

(54) DISCRETE TIME ANALOG SIGNAL PROCESSING FOR SIMULTANEOUS TRANSMIT AND RECEIVE

(71) Applicant: RAYTHEON COMPANY, Waltham, MA (US)

(72) Inventors: John P Gianvittorio, Venice, CA (US); Denpol Kultran, Hawthorne, CA (US); Harry Marr, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 269 days.

(21) Appl. No.: 15/062,025

(22) Filed: Mar. 4, 2016

(65) Prior Publication Data

US 2017/0257136 A1    Sep. 7, 2017

(51) Int. Cl.
*H04B 1/44* (2006.01)
*H04B 15/00* (2006.01)
*H03H 15/00* (2006.01)
*H04B 1/525* (2015.01)

(52) U.S. Cl.
CPC ............... *H04B 1/44* (2013.01); *H03H 15/00* (2013.01); *H04B 1/525* (2013.01); *H04B 15/00* (2013.01)

(58) Field of Classification Search
CPC combination set(s) only.
See application file for complete search history.

(56) References Cited

U.S. PATENT DOCUMENTS

| 3,300,631 | A | | 1/1967 | Vallese |
| 3,484,589 | A | | 12/1969 | Jernakoff |
| 5,479,363 | A | * | 12/1995 | Willson, Jr. ........ H03H 17/0294 708/319 |

(Continued)

FOREIGN PATENT DOCUMENTS

| EP | 1638079 A2 | 3/2006 |
| EP | 2081294 A1 | 7/2009 |

(Continued)

OTHER PUBLICATIONS

International Search Report from corresponding International Application No. PCT/US2017/012150, International Search Report dated Mar. 9, 2017 and dated Mar. 16, 2017 (4 pgs).

(Continued)

*Primary Examiner* — Nay A Maung
*Assistant Examiner* — Erica Fleming-Hall
(74) *Attorney, Agent, or Firm* — Lewis Roca Rothgerber Christie LLP (57) ABSTRACT

A reconfigurable discrete time analog signal processor includes a finite impulse response (FIR) filter configured to receive a portion of an RF transmit signal, to receive FIR coefficients, and to generate a leakage cancellation signal based on the portion of the RF transmit signal and the FIR coefficients, the FIR filter including sample and hold (SH) circuits configured to receive the portion of the RF transmit signal, to sample the portion of the RF transmit signal at successive sample times according to a sample clock, and to generate sampled analog voltage signals, and analog multipliers coupled to the SH circuits and configured to multiply the sampled analog voltage signals by binary multiplication factors to generate the leakage cancellation signal.

18 Claims, 5 Drawing Sheets

(56) References Cited

U.S. PATENT DOCUMENTS

| | | | |
|---|---|---|---|
| 5,563,819 A | 10/1996 | Nelson | |
| 5,682,165 A * | 10/1997 | Lewis | H01Q 3/267 342/174 |
| 5,886,749 A * | 3/1999 | Williams | H04N 5/211 348/611 |
| 5,931,898 A * | 8/1999 | Khoury | H03H 15/00 708/3 |
| 6,035,320 A * | 3/2000 | Kiriaki | H03H 17/06 708/316 |
| 6,529,926 B1 * | 3/2003 | Capofreddi | H03H 15/023 708/316 |
| 6,539,048 B2 * | 3/2003 | Hakala | H03H 17/0254 375/143 |
| 6,621,330 B1 | 9/2003 | Jaussi et al. | |
| 7,058,119 B1 | 6/2006 | Leveque et al. | |
| 7,058,368 B2 | 6/2006 | Nicholls et al. | |
| 7,492,848 B2 * | 2/2009 | Gurrapu | H03H 17/0657 341/61 |
| 7,532,684 B2 | 5/2009 | Tietjen | |
| 8,130,879 B2 | 3/2012 | Huang | |
| 9,252,831 B2 | 2/2016 | Rimini et al. | |
| 9,391,684 B1 * | 7/2016 | Marr | H04B 7/0617 |
| 9,703,991 B2 * | 7/2017 | Kultran | G06G 7/163 |
| 2001/0056450 A1 * | 12/2001 | Kiriaki | H03H 15/00 708/300 |
| 2002/0010727 A1 * | 1/2002 | Hughes | H03H 17/0294 708/319 |
| 2002/0062329 A1 * | 5/2002 | Capofreddi | H03H 15/02 708/319 |
| 2003/0035499 A1 * | 2/2003 | Staszewski | H03D 7/125 375/346 |
| 2003/0076899 A1 | 4/2003 | Kumar et al. | |
| 2003/0112644 A1 | 6/2003 | Martin et al. | |
| 2003/0128067 A1 * | 7/2003 | Jaussi | G06G 7/16 327/552 |
| 2003/0184338 A1 | 10/2003 | Comer et al. | |
| 2003/0202460 A1 | 10/2003 | Jung et al. | |
| 2005/0094722 A1 | 5/2005 | Takatori et al. | |
| 2005/0134369 A1 | 6/2005 | Casper et al. | |
| 2005/0271153 A1 | 12/2005 | Okamura et al. | |
| 2009/0196373 A1 * | 8/2009 | Snook | G06K 7/0008 375/269 |
| 2009/0290602 A1 | 11/2009 | McNeely | |
| 2011/0043256 A1 * | 2/2011 | Riley | H03H 15/00 327/91 |
| 2011/0267056 A1 * | 11/2011 | Frick | G01R 33/3607 324/314 |
| 2011/0282924 A1 * | 11/2011 | Mallinson | H03H 15/00 708/3 |
| 2011/0310936 A1 * | 12/2011 | Malkin | H04B 3/30 375/219 |
| 2013/0060527 A1 * | 3/2013 | Martin | G01R 13/0254 702/189 |
| 2013/0115906 A1 | 5/2013 | Forman et al. | |
| 2013/0254253 A1 * | 9/2013 | Mallinson | G06G 7/02 708/819 |
| 2013/0285766 A1 * | 10/2013 | Mallinson | H03H 7/0138 333/168 |
| 2014/0169236 A1 | 6/2014 | Choi et al. | |
| 2014/0219139 A1 | 8/2014 | Choi et al. | |
| 2015/0078226 A1 * | 3/2015 | Charlon | H04B 1/525 370/290 |
| 2016/0173187 A1 * | 6/2016 | Oh | H04B 7/15585 370/315 |
| 2017/0012607 A1 * | 1/2017 | Beffa | G06F 17/11 |
| 2017/0257136 A1 * | 9/2017 | Gianvittorio | H04B 15/00 |

FOREIGN PATENT DOCUMENTS

| | | |
|---|---|---|
| WO | WO 2002/103684 A1 | 12/2002 |
| WO | WO 03/012985 A2 | 2/2003 |
| WO | WO 2015/077741 A1 | 5/2015 |

OTHER PUBLICATIONS

Written Opinion of the International Searching Authority from corresponding International Application No. PCT/US2017/012150, dated Mar. 16, 2017 (7 pgs.).

Office action for U.S. Appl. No. 14/849,529, dated Jul. 11, 2016, 10 pages.

Cheung et al., "A Sampled-Data Switched-Current Analog 16 Tap FIR Filter with Digitally Programmable Coefficients in 0.8µm CMOS," IEEE International Solid-State Circuits Conference, vol. 40, pp. 54-55. 1997.

Wang et al., "A Low Power 170MHz Discrete-Time Analog FIR Filter,"IEEE, Custom Integrated Circuits Conference, 4 pages, 1997.

Worapishet et al., "Low Power Switched-Current FIR Core for Modern Wireless Transceivers," IEICE Trans. Electron., E87-C(11): 1903-1909, Nov. 2004.

International Search Report and Written Opinion for International Application No. PCT/US2016/041371, dated Oct. 18, 2016, 11 pages.

\* cited by examiner

DISCRETE TIME ANALOG SIGNAL PROCESSING FOR SIMULTANEOUS TRANSMIT AND RECEIVE

CROSS-REFERENCE TO RELATED APPLICATION

This application is related to a U.S. Patent Application entitled "Discrete Time Current Multiplier Circuit" (application Ser. No. 14/849,529), filed on Sep. 9, 2015, issued Jul. 11, 2017 as U.S. Pat. No. 9,703,991, the entire content of which is incorporated herein by reference.

This application is also related to a U.S. Patent Application entitled "Discrete Time Polyphase Channelizer" (application Ser. No. 14/849,524), filed on Sep. 9, 2015, issued Mar. 20, 2018 as U.S. Pat. No. 9,923,549, the entire content of which is incorporated herein by reference.

FIELD

Embodiments of the present invention relate to the field of signal processing for self-interference and noise cancellation.

BACKGROUND

Communication systems, and in particular wireless communication systems, often employ leakage suppression systems for reducing transceiver signals and noise. Such systems are utilized to suppress signals and noise in the receive path arising from leakage introduced in the receive band from the transmit path. When an antenna element is shared by both the transmit path and the receive path, such interference in the receive path may result from the transmitted signal being reflected by the antenna element back into the receive path.

A further problem with such leakage suppression systems is that while they may provide effective cancellation of interference signals, the circuitry required is often complex, large, costly, and has relatively high insertion loss. The relative large size of some leakage suppression systems, such as tapped delay line noise cancellers, prevents such solutions from being utilized in phased array antennas at high frequencies where the spacing between adjacent antenna elements of an antenna system is small.

The above information disclosed in this Background section is only for enhancement of understanding of the background of the invention, and therefore it may contain information that does not form the prior art that is already known to persons of ordinary skill in the art.

SUMMARY

Aspects of embodiments of the present invention are directed to discrete time analog signal processing in a system for simultaneous transmit and receive of radio frequency (RF) signals (hereinafter, a TX/RX system). The TX/RX system includes a chip-scale, programmable, discrete time analog leakage canceller capable of wide-band suppression of leakage in the receive path of the TX/RX system.

Aspects of embodiments of the present invention are directed to a canceller using polyphased discrete time samples arranged into a finite impulse response (FIR) filter to act as tapped delay lines for feed forward cancellation in a TX/RX system.

According to some embodiments of the present invention, there is provided a reconfigurable discrete time analog signal processor configured to reduce transmit leakage in a simultaneous transmit and receive system, the reconfigurable discrete time analog signal processor including: a finite impulse response (FIR) filter configured to receive a portion of an RF transmit signal, to receive FIR coefficients, and to generate a leakage cancellation signal based on the portion of the RF transmit signal and the FIR coefficients, the FIR filter including: a plurality of sample and hold (SH) circuits configured to simultaneously receive the portion of the RF transmit signal, to sample the portion of the RF transmit signal at successive sample times according to a sample clock, and to generate a plurality of sampled analog voltage signals; a plurality of programmable analog multipliers coupled to the plurality of SH circuits and configured to multiply the plurality of sampled analog voltage signals by a plurality of binary multiplication factors to generate the leakage cancellation signal; and a timing controller configured to generate a plurality of control signals for triggering sample times of the plurality of SH circuits, wherein consecutive ones of the plurality of control signals are offset in time by a sampling period.

In an embodiment, the FIR filter further includes a load controller configured to receive FIR coefficients and to reconfigure the reconfigurable discrete time analog signal processor by generating the plurality of binary multiplication factors based on the received FIR coefficients.

In an embodiment, the reconfigurable discrete time analog signal processor further includes a coefficient calculator configured to generate the FIR coefficients based on the portion of the RF transmit signal, the portion of the RF receive signal, and a portion of the leakage cancellation signal.

In an embodiment, the coefficient calculator is configured to generate the FIR coefficients using an adaptive filtering algorithm.

In an embodiment, each one of the plurality of sampled analog voltage signals have a same duration and are staggered in time.

In an embodiment, the leakage canceller further includes a plurality of coefficient registers configured to supply the plurality of binary multiplication factors to the plurality of programmable analog multipliers, wherein the plurality of coefficient registers include a same plurality of coefficients.

In an embodiment, each one of the plurality of coefficient registers includes a rotating shift register configured to store a plurality of coefficients, and to circularly rotate the plurality of coefficients through memory positions of the rotating shift register at each one of the successive sample times.

In an embodiment, the received portion of the RF transmit signal includes a differential analog signal.

In an embodiment, the generated leakage cancellation signal includes a differential analog signal.

According to some embodiments of the present invention, there is provided a system for simultaneous transmit and receive of radio frequency (RF) signals configured to reduce transmit leakage, the system including: a transmit signal generator configured to generate an RF transmit signal; an aperture configured to wirelessly transmit the RF transmit signal and to receive an RF receive signal; an analog leakage canceller configured to receive a portion of the RF transmit signal, to receive finite impulse response (FIR) coefficients, and to generate a leakage cancellation signal based on the portion of the RF transmit signal and the FIR coefficients; a combiner configured to combine the RF receive signal and the leakage cancellation signal to generate a reduced-noise RF receive signal, wherein the leakage canceller includes: a plurality of sample and hold (SH) circuits configured to simultaneously receive the portion of the RF transmit signal, to sample the portion of the RF transmit signal at successive sample times according to a sample clock, and to generate a plurality of sampled analog voltage signals; and a plurality of programmable analog multipliers coupled to the plurality of SH circuits and configured to multiply the plurality of sampled analog voltage signals by a plurality of binary multiplication factors to generate the leakage cancellation signal.

In an embodiment, the system further includes a coefficient calculator configured to generate the FIR coefficients based on the portion of the RF transmit signal, the portion of the RF receive signal, and a portion of the leakage cancellation signal, using adaptive filtering algorithms.

In an embodiment, the leakage canceller further includes a load controller configured to receive the FIR coefficients and to reconfigure the leakage canceller by generating the plurality of binary multiplication factors based on the received FIR coefficients.

In an embodiment, the transmit signal generator is configured to source an RF signal based on an input data signal to be transmitted, to adjust a phase angle of the RF signal, and to amplify the RF signal using variable gain to generate the RF transmit signal.

In an embodiment, the leakage canceller further includes a timing controller configured to generate a plurality of control signals for triggering sample times of the plurality of SH circuits, wherein consecutive ones of the plurality of control signals are offset in time by a sampling period.

In an embodiment, the leakage canceller further includes a plurality of coefficient registers configured to supply the plurality of binary multiplication factors to the plurality of programmable analog multipliers, wherein the plurality of coefficient registers include a same plurality of coefficients, and each one of the plurality of coefficient registers includes a rotating shift register configured to store a plurality of coefficients, and to circularly rotate the plurality of coefficients through memory positions of the rotating shift register at each one of the successive sample times.

In an embodiment, the leakage canceller further includes a single-input to dual-output (S2D) converter configured to receive the portion of the RF transmit signal and to convert the portion of the RF transmit signal to a balanced differential signal prior to supplying said signal to the plurality of SH circuits, and the plurality of SH circuits and the plurality of programmable analog multipliers operate in a differential signal mode.

In an embodiment, the leakage canceller further includes a dual-input to single-output (D2S) converter configured to convert a balanced differential output current signal of the plurality of programmable analog multipliers to the leakage cancellation signal, the leakage cancellation signal being an unbalanced non-differential signal.

In an embodiment, the leakage canceller further includes a track and hold circuit at an input of the plurality of SH circuits, the track and hold circuit being configured to expand an operating bandwidth of the leakage canceller, and the track and hold circuit operates at a frequency that is up to a 100 times as high as an operating frequency of the plurality of SH circuits.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as applicable to other similar features or aspects in other exemplary embodiments. Like reference numerals designate like elements throughout the specification.

Aspects of embodiments of the present invention are directed to discrete time analog signal processing in a system for simultaneous transmit and receive of radio frequency (RF) signals (hereinafter, a TX/RX system). The TX/RX system includes a chip-scale, programmable, discrete time analog leakage canceller (herein after referred to a "leakage canceller") capable of wide-band suppression of feedforward signal and noise in the receive path of the TX/RX system. Suppression at the operating transmit frequency instead of at an intermediate frequency inside a receiver or at the digitized version of the high power transmit signal at the low noise amplifier (LNA) of the system receiver allows the receiver LNA to remain in linear mode 100% of the time, even when the array is transmitting.

Aspects of embodiments of the present invention are directed to a leakage canceller using polyphased discrete time samples arranged into a finite impulse response (FIR) filter to act as tapped delay lines for feed forward cancellation in a TX/RX system. In some embodiments, the FIR tap spacing is set by the time sample rate, which also sets the achievable cancellation, as the time sample rate needs to be above the Nyquist rate of the bandwidth over which the cancellation will act. Using clocked discrete time samples allows the FIR filter to have long delays between taps, which may be longer than those achievable with physical tapped delay lines of the related art. Further longer delays between a fixed number of taps increases the length in time allowed for arriving interfering signals, meaning that more scatters of the transmit signal can be cancelled from the receive path of the TX/RX system. The FIR filter, according to embodiments of the present invention, enables on-chip packaging, which allows for the leakage canceller to fit within an antenna lattice up to and including X and Ku frequency bands.

Figure 1:
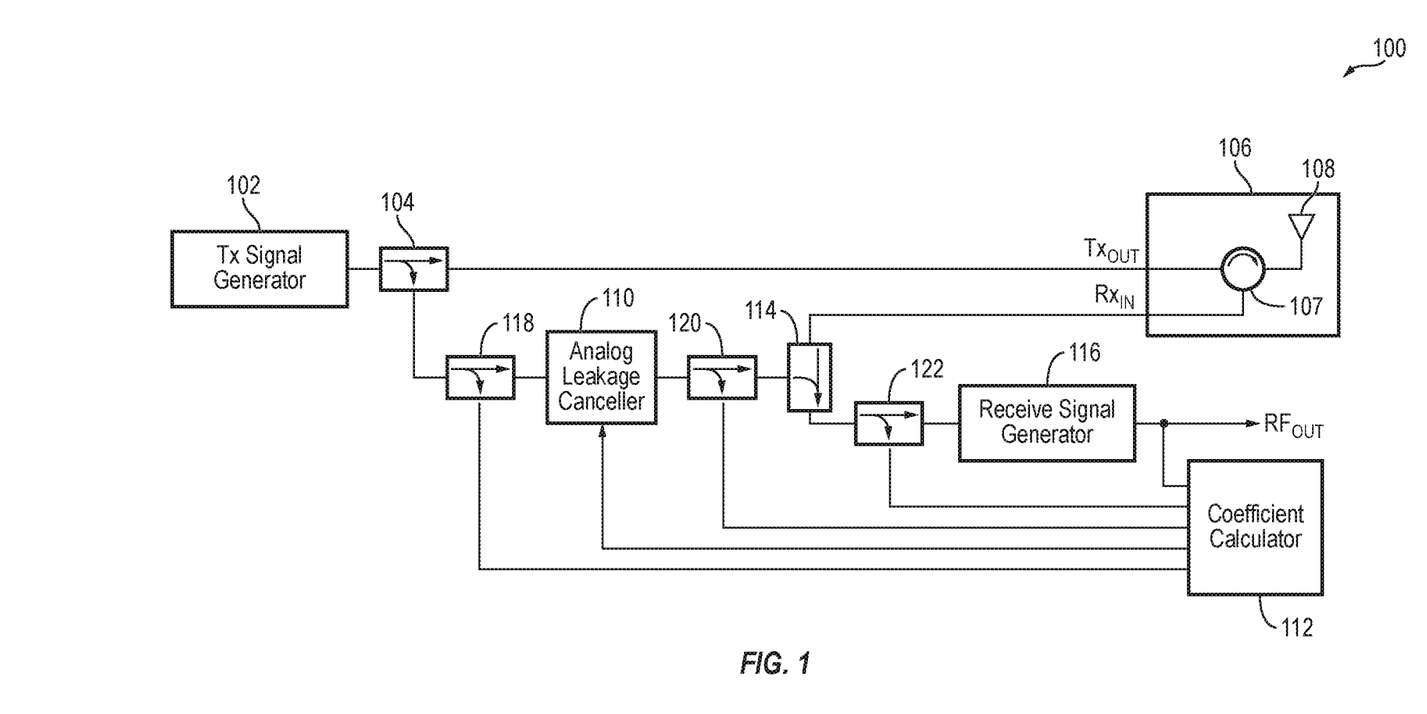
FIG. 1 is a schematic illustrating a system for simultaneous transmit and receive, which is configured to reduce feedforward leakage at the radio frequency (RF) frequency of operation, according to some exemplary embodiments of the present invention.

FIG. 1 is a schematic illustrating a system for simultaneous transmit and receive (TX/RX system) 100, which is configured to reduce feedforward leakage, according to some exemplary embodiments of the present invention.

Referring to FIG. 1, the transmit signal generator 102 generates an RF transmit signal. The transmit signal generator 102 may include an exciter for sourcing a radio frequency (RF) signal that is based on an input data signal, which is to be transmitted. The transmit signal generator 102 may further include a variable phase shifter and a variable attenuation controller for adjusting a phase angle and the amplitude, respectively, of the RF signal, which may be utilized for operating the TX/RX system 100 as, for example, a phased array. Thus, the transmit signal generator 102 generates and beam steers the RF transmit signal when, for example, the TX/RX system 100 is utilized as an element in a phased array.

A first coupler 104 supplies a portion (e.g., 90%) of the RF transmit signal to the aperture 106 for transmission (e.g., wireless transmission). The aperture 106 may include a circulator 107 and an antenna element 108 (which may be part of a phase array antenna). The antenna element 108 emits radio waves corresponding to the RF transmit signal and intercepts radio waves corresponding to an RF receive signal. The circulator 107 transfers the RF transmit signal at a first port $TX_{OUT}$ to the antenna element 108 and transfers the RF receive signal from the antenna element 108 to a second port $RX_{IN}$. In some examples, the transmission and receiving of RF signals may occur concurrently or with transmission and reception being separated in time and/or frequency. In some embodiments, each of the RF transmit signal and the RF receive signal may be in a frequency range of about 300 MHz to about 18 GHz (e.g., occupying the UHF-band, L-band, S-band, X-band, and/or the Ku-bands of the frequency spectrum).

The first coupler 104 also provides a portion (e.g., about 10%) of the RF transmit signal to the leakage canceller 110, which is configured to generate a leakage cancellation signal (e.g., a feed-forward cancellation signal), which is a time-delayed, amplitude and/or phase modulated signal, based on the portion of the RF transmit signal and a number of finite impulse response (FIR) coefficients received from the coefficient calculator 112. When combined with the RF receive signal at the combiner 114, the cancellation signal cancels or substantially reduces the feedforward leakage in the RF receive signal, thus producing a reduced-leakage RF receive signal, which increases the transmit-to-receive isolation of the system.

The feedforward cancellation signal may be affected by a number of leakage sources including, for example, some of the energy of the RF transmit signal travelling in the wrong direction through the circulator 107 and being passed through to the receive path (e.g., through the second port $RX_{IN}$ of the transceiver 106), some of the energy of the RF transmit signal reflected back from antenna element (e.g., due to impedance mismatch) and returning (e.g., bouncing back) through to the receive path, and energy leakage resulting from the mutual coupling between adjacent antenna elements of a phase array antenna (e.g., an active electronically scanned array), and/or the like.

According to some embodiments, the leakage canceller 110 in effect inverts a copy of the RF transmit signal, properly delays it to time align with the leakage in the receive path, and injects it back into the receive path of the TX/RX system 100 to cancel or substantially reduce the feed-forward leakage that leaks back in the receive path at the aperture 106.

As a result of the operation of the leakage canceller 110, a low noise amplifier at the input of the receive signal generator 116 may operate in linear mode even when the TX/RX system 100 is transmitting the RF transmit signal, thus greatly reducing distortion in, and improving the signal to noise ratio of, the output RF signal retrieved by the receive signal generator 116.

The coefficient calculator 112 samples the portion of the RF transmit signal (e.g., the portion received from the first and second couplers 104 and 118), the analog leakage cancellation signal, the reduced-leakage RF receive signal, and the output RF signal via, for example, the second coupler 118, the third coupler 120, and the fourth coupler 122, and generates FIR coefficients based on said signals using adaptive filter algorithms in either the frequency or time domain, such as a least mean square algorithm or a recursive least square algorithm.

While in some examples, each of the first, second, third, and fourth couplers 104, 118, 120, and 122 may be split out about 10% of the respective input signals, embodiments of the present invention are not limited thereto. That is, each of the first through fourth couplers may split out only a sufficient portion of their respective input signals such that the split signal may be utilized by a respective one of the leakage canceller 110 and the coefficient calculator 112 without further amplification (which would introduce further noise and signal distortion).

According to some embodiments, the leakage canceller 110 includes a chip-scale, wide-bandwidth, programmable, discrete-time analog finite impulse response (FIR) filter (hereinafter referred to as a FIR analog leakage canceller) for filtering (e.g., cancelling) the leakage present in receive path of the TX/RX system 100.

Figure 2:
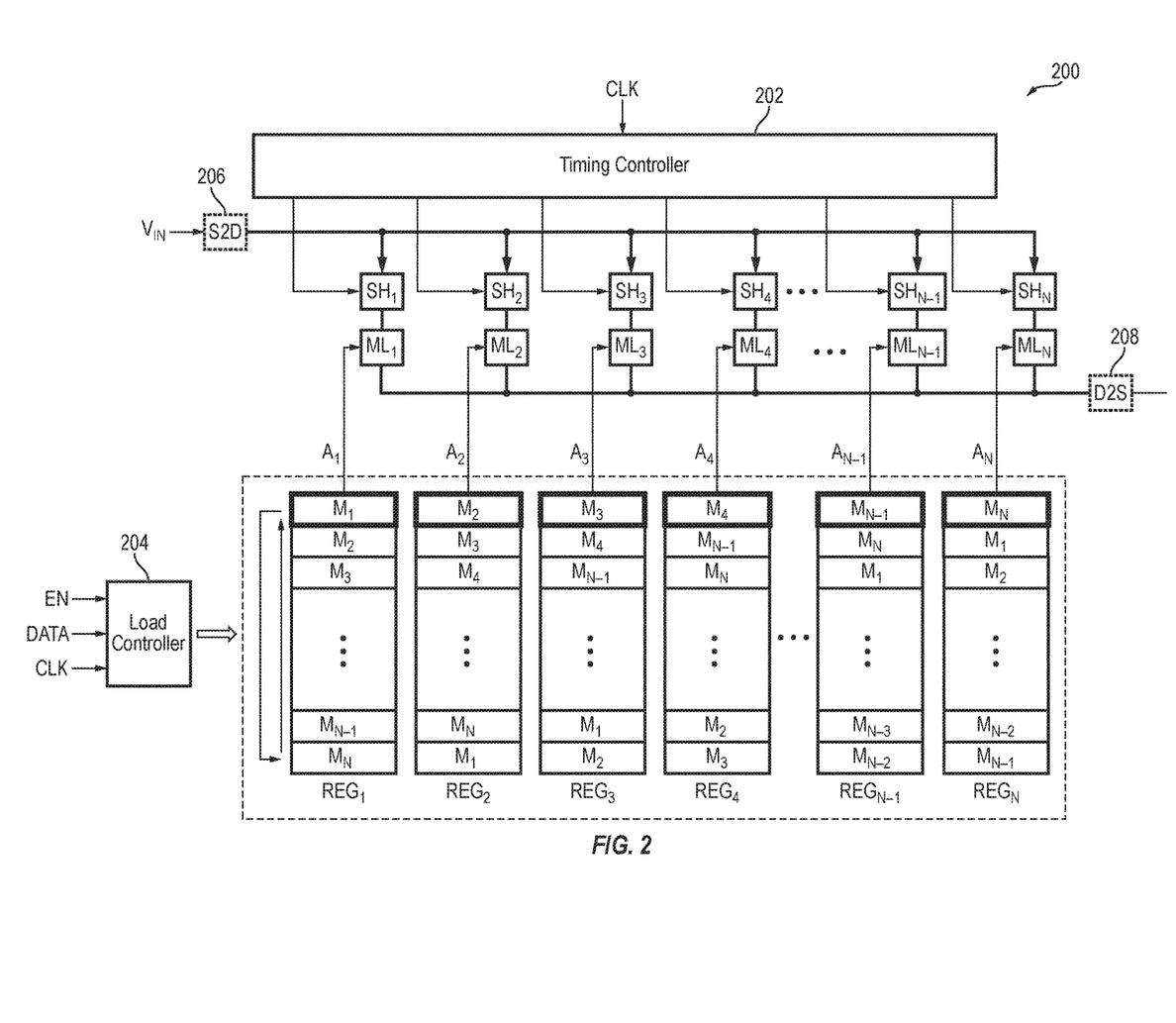
FIG. 2 is a block diagram of an analog finite impulse response filter of a leakage canceller, according to some embodiments of the present invention.

FIG. 2 is a functional block diagram of a chip-scale circuit of a programmable discrete time FIR analog leakage canceller 200, according to some embodiments of the present invention.

As shown, the FIR analog leakage canceller 200 has N taps (N being an integer greater than 1) and includes a plurality of sample and hold (S/H) circuits $SH_1$ to $SH_N$ for sampling and holding an input voltage signal (e.g., the portion of the RF transmit signal received from the first and second couplers 104 and 118 of FIG. 1) for a period of time (e.g., one time unit), a plurality of programmable analog multipliers $ML_1$ to $ML_N$ for converting the respective voltages sampled by the S/H circuits $SH_1$ to $SH_N$ to an amplified current signal, and a plurality of coefficient registers $REG_1$ to $REG_N$ for providing appropriate multiplication factors (e.g., binary multiplication factors/coefficients $A_1$ to $A_N$) to the analog multipliers $ML_1$ to $ML_N$.

In some embodiments, the timing of the sample and hold operation of the S/H circuits $SH_1$ to $SH_N$ may be controlled by a timing controller (or clock signal generator) 202, which generates a plurality of staggered control (or enable/clock) signals (e.g., enable/clock signals that are delayed/shifted in time), such that only one of the S/H circuits $SH_1$ to $SH_N$ samples the input voltage signal $V_{IN}$ at any given period. Thus, the sampled voltage signals supplied to successive ones of the analog multipliers $ML_1$ to $ML_N$ by the S/H circuits $SH_1$ to $SH_N$ will be delayed in time by one sampling period (e.g., inverse of sampling frequency). Further, when a S/H circuit $SH_k$ samples the input voltage signal $V_{IN}$, the sampled voltage signal is maintained at the output of S/H circuit $SH_k$ for a period of N clock cycles, after which point the S/H circuit unit $SH_k$ resamples the input voltage signal $V_{IN}$. In some examples, the input voltage signal $V_{IN}$ may be a continuous-time analog signal or may be a discrete-time analog signal (e.g., a sampled continuous-time signal as described below with reference to FIG. 3). The FIR analog leakage canceller 200 exhibits less signal distortion as those of the related art. Further, as the analog multipliers $ML_1$ to $ML_N$ output current signals (rather than voltage signals), their outputs may be added simply by connecting the output ports of the analog multipliers $ML_1$ to $ML_N$ together.

The analog FIR filter is programmable. According to some embodiments, each of the plurality of coefficient registers (e.g., coefficient look-up tables) $REG_1$ to $REG_N$ stores a plurality of coefficients, as calculated by the coefficient calculator 112, which represent multiplication factors applied by analog multipliers $ML_1$ to $ML_N$ to generate the output signal $I_{OUT}$ (e.g., the analog leakage cancellation signal). In some examples, each of the coefficient registers $REG_1$ to $REG_N$ stores the same N coefficients (e.g., uncalibrated coefficients) $M_1$ to $M_N$, however, the coefficients may be staggered. That is, a coefficient $M_i$ (i being an integer from 1 to N) may occupy a first memory position in $REG_i$, a second memory position in $REG_{i+1}$, and so forth. Similarly, a coefficient $M_{i+1}$ may occupy a second memory position in $REG_i$, a third memory position in $REG_{i+1}$, and so forth.

In some embodiments, each of the coefficient registers may be implemented as rotating shift registers in which the coefficients are rotated (e.g., circularly rotated) through the shift register memory positions at each sample time, that is, by moving the final entry to the first position, while shifting all other entries to the next position, or by performing the inverse operation. The circular shift of the coefficients may occur in synchronization with the S/H circuits $SH_1$ to $SH_N$. In some examples, the timing of the coefficient registers $REG_1$ to $REG_N$ may be controlled by the timing controller 202. A coefficient occupying the first memory position at each of the coefficient registers $REG_1$ to $REG_N$ may be applied to a respective one of the analog multipliers $ML_1$ to $ML_N$ as a multiplication factor (e.g., one of $A_1$ to $A_N$).

In some embodiments, the outputs of all of the analog multipliers $ML_1$ to $ML_N$ may be summed together (e.g., the corresponding outputs may be physically and/or electrically tied together) to generate a single output current signal $I_{OUT}$ (e.g., the analog leakage cancellation signal) expressed as:

$$I_{out} = \Sigma_{k=0 \text{ to } N} A_k \times V_{IN}(n-k) = M_1 \times V_{IN}(n) + M_2 \times V_{IN}(n-1) \ldots + M_N \times V_{IN}(n-N+1) \quad \text{(Equation 1)}$$

where $V_{IN}(n)$, $V_{IN}(n-1)$, and $V_{IN}(n-N+1)$ represent sampled input voltages at consecutive sample times $t_1$ through $t_N$, respectively.

Because the output of each of the analog multipliers $ML_1$ to $ML_N$ is current, the summation operation of Equation 1 may be achieved by connecting together the respective outputs (e.g., output wires). Thus, summation at the FIR analog leakage canceller 200 is an inherently linear operation. This greatly improves performance over the FIR filters of the related art that utilize voltage adders, which are intrinsically non-linear.

The number of taps (N) and the coefficients applied to the taps of the FIR analog leakage canceller 200, which are stored/generated by the coefficient registers $REG_1$ to $REG_N$, determine the tapped delay line output profile (e.g., center frequency, bandwidth, and shape) of the FIR analog leakage canceller 200. Further, as the coefficients stored/generated by each of the coefficient registers $REG_1$ to $REG_N$ is in the form of digital bits, the tapped delay line profile of the FIR analog leakage canceller 200 may be programmed (e.g., by the coefficient calculator 112 or reconfigured through software/hardware) as desired (e.g., during the operation of the FIR analog leakage canceller 200).

In some examples, each of the coefficients $M_1$ to $M_N$ may be 10-bits numbers; however, embodiments of the present invention are not limited thereto, and the coefficients $M_1$ to $M_N$ may have any suitable number of bits.

According to some embodiments, the coefficients $M_1$ to $M_N$ may be loaded into the plurality of coefficient registers $REG_1$ to $REG_N$ by the load controller 204, which receives the input DATA (e.g., the FIR coefficients) from the coefficient calculator 112. The load controller 204 may also receive an enable signal EN from the coefficient calculator 112 indicating when to reprogram the coefficient registers $REG_1$ to $REG_N$ of the FIR analog leakage canceller 200. In some examples, the timing controller 202 and the load controller 204 may receive a same clock signal CLK (oscillating, e.g., at about 3.25 GHz); however, embodiments of the present invention are not limited thereto, and the timing controller 202 and the load controller 204 may receive different clock signals oscillating at any suitable frequency. In some examples, the coefficient may be clocked at a frequency of about 10 MHz to about 4 GHz depending on the length in time of the FIR filter, which is determined by the length of the signal that needs to be cancelled.

In some embodiments, the FIR analog leakage canceller 200 includes a single-input to dual-output (S2D) converter 206, which receives the input voltage signal $V_{IN}$ (e.g., the portion of the RF transmit signal received from the first and second couplers 104 and 118 of FIG. 1) and converts the input voltage signal $V_{IN}$ to a balanced differential signal prior to supplying said signal to the plurality of S/H circuits $SH_1$ to $SH_N$. As the plurality of analog multipliers $ML_1$ to $ML_N$ operate in a differential signal mode, in some embodiments, the FIR analog leakage canceller 200 also includes a dual-input to single-output (D2S) converter 208, which converts the balanced differential output current signal $I_{OUT}$ of the plurality of analog multipliers $ML_1$ to $ML_N$ to an unbalanced non-differential noise cancellation signal. In other embodiments, the S2D and D2S converters 206 and 208 may be external to the FIR analog leakage canceller 200.

In some examples, the FIR analog leakage canceller 200 may be a 16 tap filter (where N=16); however, embodiments of the present invention are not limited thereto, and any suitable number of taps may be utilized.

A more complete description of the analog programmable FIR filter is provided in a co-owned pending U.S. application Ser. No. 14/849,529, filed on Sep. 9, 2015, entitled "Discrete Time Current Multiplier Circuit," and in a co-owned pending U.S. application Ser. No. 14/849,524, entitled "Discrete Time Polyphase Channelizer," filed on Sep. 9, 2015.

Figure 3:
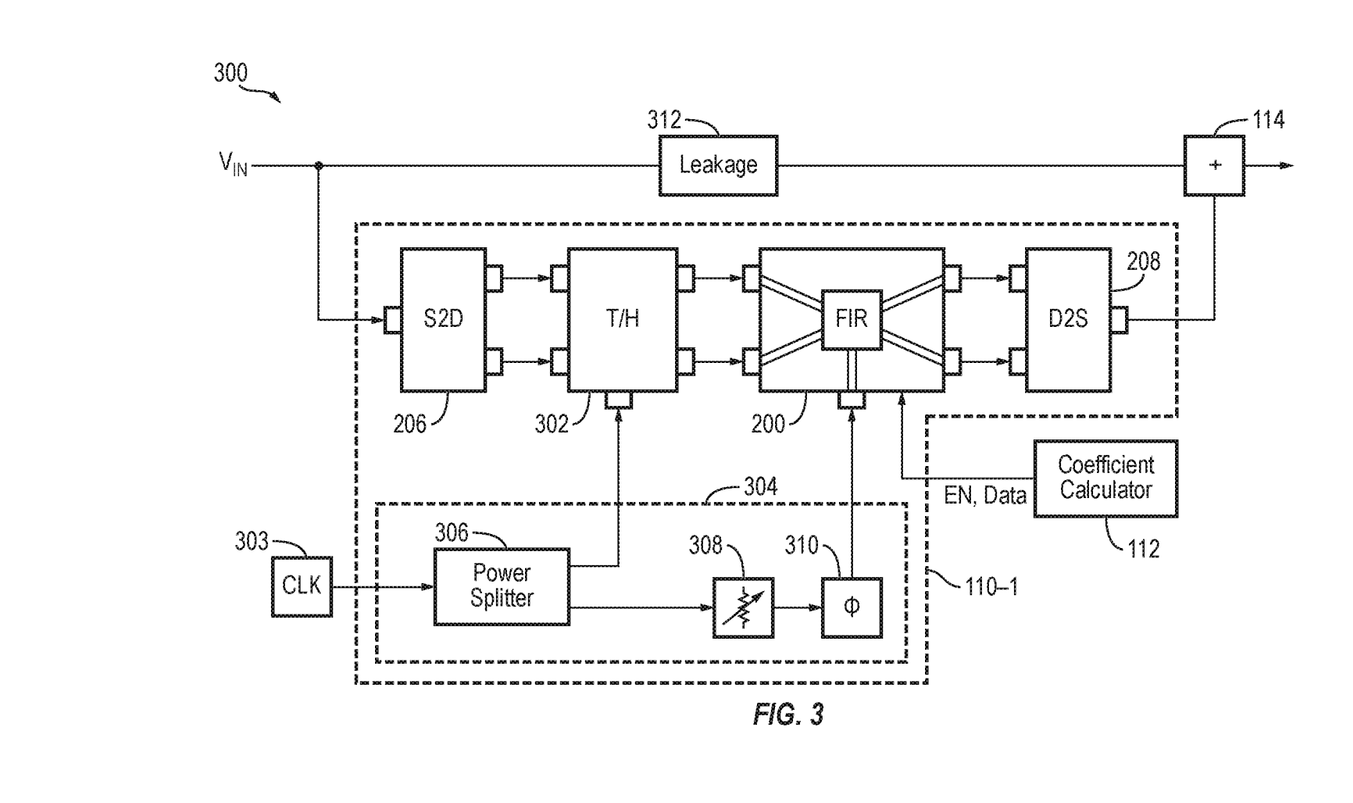
FIG. 3 is a block diagram illustrating the operation of the leakage canceller including the analog FIR filter, according to some embodiments of the present invention.

FIG. 3 is a block diagram 300 illustrating the operation of the leakage canceller 110-1 including the FIR analog leakage canceller 200, according to some embodiments of the present invention.

Referring to FIG. 3, the leakage canceller 110-1 includes a track and hold (T/H) circuit (e.g., a wide-band fully-differential T/H circuit) 302 at the input of the FIR analog leakage canceller 200. The T/H circuit 302 may be utilized to expand the input bandwidth and/or high-frequency linearity of the FIR analog leakage canceller 200. Thus, while the T/H circuit operates at the Nyquist rate of the input signal (i.e., the RF transmit signal), each of the S/H circuits $SH_1$ to $SH_N$ of the (N-tap) FIR analog leakage canceller 200 may operate at 1/N$^{th}$ of the Nyquist rate and may significantly relax the settling time requirement for the S/H circuits in 200 than it would have without the use of the T/H circuit 302. As a result, the T/H circuit 302 simplifies the design of the FIR analog leakage canceller 200 and allows the leakage canceller 110-1 to operate at a higher bandwidth. The single T/H circuit 302 may have a very high linearity up to the frequency band of interest, which may be, for example, up to the Ku band. As such, the transistors in the T/H circuit 302 may be fabricated with materials such as Gallium Nitride or Indium Phosphide, or other suitable materials. The multiple S/H circuits in the FIR analog leakage canceller 200, on the other hand, may be fabricated in commercial silicon processes, such as CMOS or SiGe. In some examples, the number of taps N of the FIR analog leakage canceller 200 may be 16, thus, each S/H circuit may operate at 1/16$^{th}$ of the Nyquist rate.

In some embodiments, the clock signal generated by the clock generator 303 is distributed to the clock distribution network 304, which includes a power splitter 306, which splits the energy of the clock signal between the T/H circuit 302 and the FIR analog leakage canceller 200, and an attenuator 308 and phase shifter 310, which perform time alignment of the clock signal driving the FIR analog leakage canceller 200. In some examples, the clock distribution network 304 supplies a differential clock signal to the T/H circuit 302 and the FIR analog leakage canceller 200.

In some examples, the S2D converter 206 and the D2S converter 208 are coupled to the input of the T/H circuit 302 and the output of the FIR analog leakage canceller 200, respectively, to enable differential operation on a single-ended RF transmit signal.

The combiner 114 destructively adds together the leakage cancellation signal output by the FIR analog leakage canceller 200 and the leakage in the receive path, which is conceptually represented by the operation of the leakage block 312 on the input RF signal $V_{IN}$ (i.e., the RF transmit signal).

In some examples, the leakage canceller 110-1 may further include a bandpass filter at its input for filtering the signal received by the FIR analog leakage canceller 200. The bandpass filter may be used to reject signal aliases and other unwanted signals and spurs. The leakage canceller 110-1 may also include an analog filter at its output to smooth the discrete-time leakage cancellation signal into a continuous-time signal.

Figure 4A:
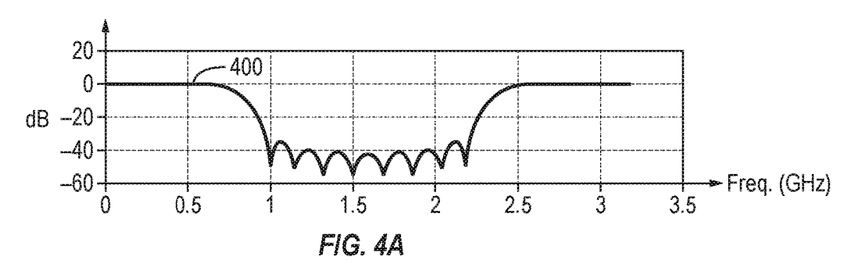
FIGS. 4A-4C are graphical illustrations of the performance characteristics of the FIR analog leakage canceller in the system of FIG. 1, according to some exemplary embodiments of the present invention.
Figure 4B:
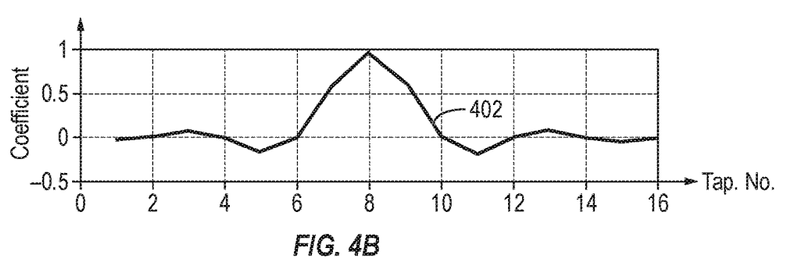
Figure 4C:
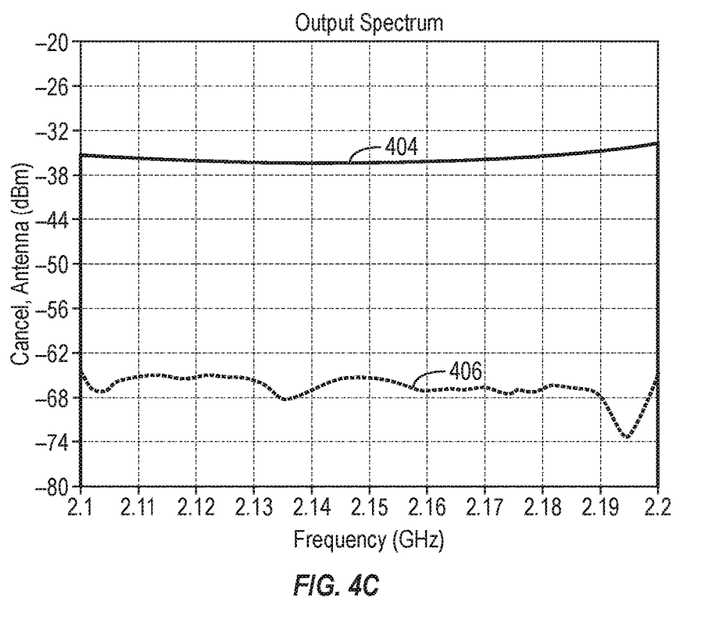

FIGS. 4A-4C are graphical illustrations of the performance characteristics of the FIR analog leakage canceller 200 in the TX/RX system 100, according to some exemplary embodiments of the present invention operating as a FIR filter.

FIG. 4A is a diagram illustrating the frequency response 400 of a 16-tap FIR analog leakage canceller 200, and FIG. 4B shows a curve 402 representing the analog values of the coefficients applied to the 16 taps of the FIR analog leakage canceller 200 of FIG. 4A. This bandstop filter response shown from the output of the FIR analog leakage canceller 200 based on the coefficient values depicted in FIG. 4B is one example of a FIR output of FIR analog leakage canceller 200 by itself. When used as an analog canceller, the output of FIR analog leakage canceller 200 matches the response of the leakage as measured at the combiner 114.

FIG. 4C illustrates a comparison of the spectrum of the leakage in the receive path of the TX/RX system 100 with and without the operation of the leakage canceller 110 (or 110-1), according to some exemplary embodiments of the present invention. Referring to FIG. 4C, the curve 404 represents the frequency spectrum of the leakage in the receive path of the TX/RX system 100 in the absence of a leakage canceller, and the curve 406 represents the frequency spectrum of the leakage remaining in the receive path in the presence of the leakage canceller 110 (or 110-1). As shown in FIG. 4C, in some examples, the leakage canceller 110 (or 110-1) may reduce leakage in the receive path of the TX/RX system 100 by about 30 dB to about 60 dB. This level of analog cancellation at RF backs the receiver LNA out of saturation back into operation in the linear mode. This may allow further cancellation, up to, for example, about 60 dB, to be implemented digitally, by digitizing the signal and using digital processing techniques to remove more of the leakage signal from the digitized receive signal.

Figure 5:
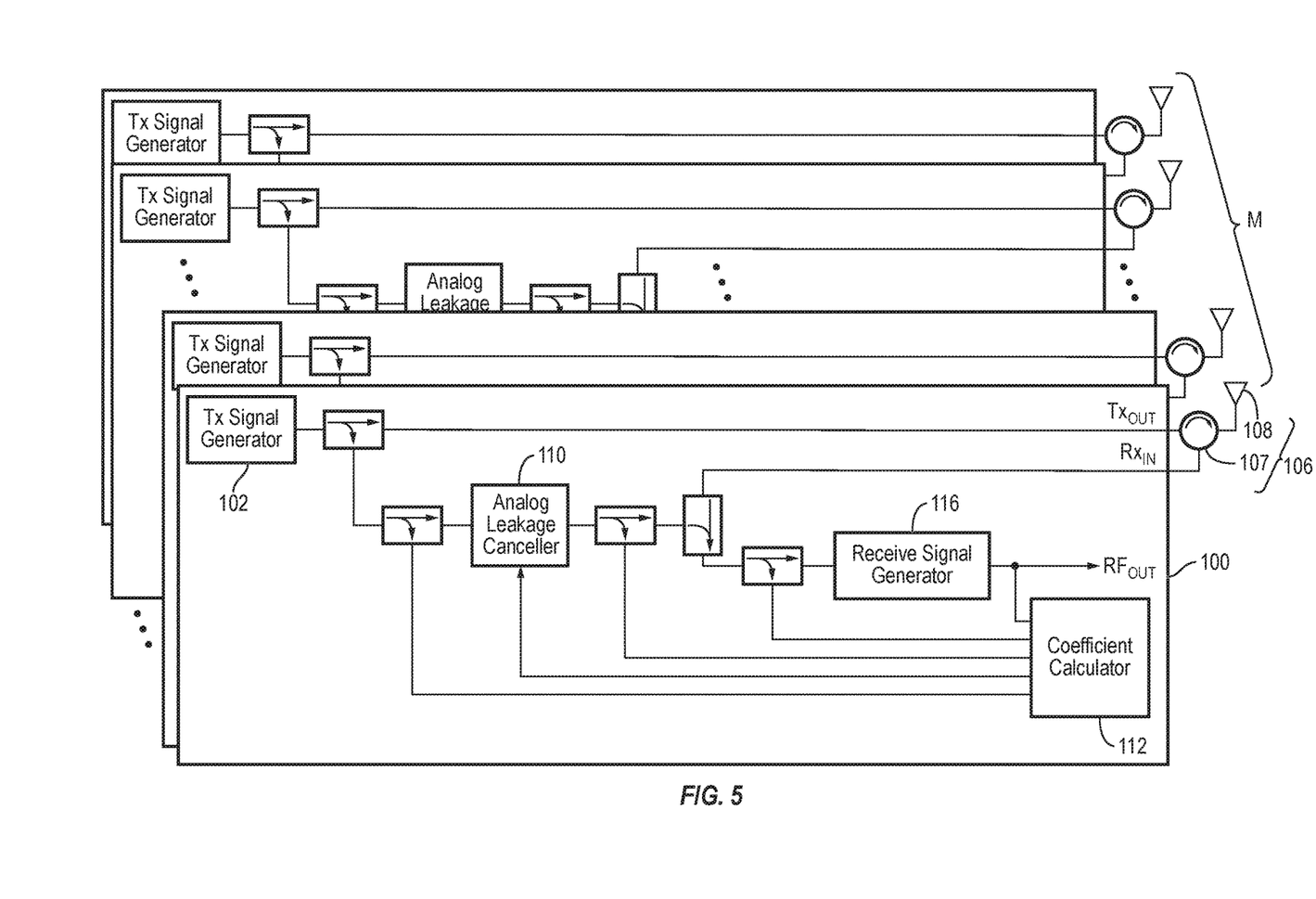
FIG. 5 is a block diagram illustrating a phased array antenna having M antenna elements and utilizing leakage cancellers, according to some exemplary embodiments of the present invention.

FIG. 5 is a block diagram illustrating a phased array antenna 500 having M (an integer greater than 1) antenna elements and utilizing leakage cancellers 110/110-1, according to some exemplary embodiments of the present invention.

Referring to FIG. 5, each antenna element 108 of the phased array antenna 500 has a corresponding TX/RX system 100 that fits within the spacing between adjacent antenna elements 108. For example, when operating at frequencies of about 2-18 GHz, the TX/RX system 100 may be packaged to fit within an area of about 1 cm$^2$. The small form factor of the TX/RX system 100 with chip-scale analog cancellation at every antenna element (which may prevent the receiver LNA from saturating due to the high power transmit signal leakage at every antenna element), is made possible, in part, by the chip scale delay circuits which generate the delay between taps via a sample clock rate. This is in contrast to the conventional tapped delay line canceller, which uses long delay lines (e.g., coaxial cables) to achieve the necessary delay between adjacent taps. For example, the delay between consecutive taps may be on the order of a few nanoseconds, which translates to using delay lines (e.g., coaxial cables) that may be on the order of a meter long. The space occupied by such delay lines makes the conventional tapped delay line canceller prohibitively large, and prevents it from being packaged in a single chip form factor, required for use in a phased array, as is readily possible with the TX/RX system 100 according to some embodiments of the present invention.

Further, because the FIR analog leakage canceller 200 of the TX/RX system 100 utilizes complex multipliers and rotating coefficients, the leakage canceller 110 (or 110-1) according to some embodiments of the present invention is capable of achieving a significantly higher bandwidth and lower additional noise being added to the receive signal than the conventional tapped delay line canceller, which utilizes lossy attenuators and phase shifters or vector modulators in each of its taps. The conventional lossy tapped delay lines require amplification in the chain of the tapped delay line. This amplification adds noise to the cancellation signal that is added to the receive signal when added with the leakage in the combiner 114. The FIR analog leakage canceller 200 uses, in some examples, a single T/H circuit at the front of the circuit that sets the noise figure for the rest of the circuit. This single T/H circuit may be designed to add very little additional noise to the circuit improving the overall noise figure of the receiver system with the integrated analog leakage canceller versus the same system implemented with conventional tapped delay lines.

While one or more exemplary embodiments have been described with reference to the figures, it will be understood by those of ordinary skill in the art that various suitable changes in form and details may be made thereto without departing from the spirit and scope of the inventive concept as defined by the following claims, and equivalents thereof.

It will be understood that, although the terms "first," "second," "third," etc., may be used herein to describe various elements or components, these elements or components should not be limited by these terms. These terms are used to distinguish one element or component from another element or component. Thus, a first element or component discussed above could be termed a second element or component, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

It will be understood that when an element or component is referred to as being "connected to" or "coupled to" another element or component, it can be directly connected to or coupled to the other element or component, or one or more intervening elements or components may be present. When an element or layer is referred to as being "directly on," "directly connected to," or "directly coupled to" another element or component, there are no intervening elements or components present.

As used herein, "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The coefficient calculator 112 and FIR analog leakage canceller 200, and/or any other relevant devices or components (hereinafter collectively referred to as "processing devices"), according to embodiments of the present invention described herein, may be implemented utilizing any suitable hardware, firmware (e.g., an application-specific integrated circuit, field programmable gate arrays, and/or the like), software, or a suitable combination of software, firmware, and hardware. For example, the various components of each of the processing devices may be formed on one integrated circuit (IC) chip or on separate IC chips. Further, the various components of each of the processing devices may be implemented on a flexible printed circuit film, a tape carrier package (TCP), a printed circuit board (PCB), or formed on a same substrate. Further, the various components of each of the processing devices may be a process or thread, running on one or more processors, in one or more computing devices, executing computer program instructions and interacting with other system components for performing the various functionalities described herein. Also, a person of ordinary skill in the art should recognize that the functionality of various processing devices may be combined or integrated into a single processing device, or the functionality of a particular computing device may be distributed across one or more other processing devices without departing from the scope of the exemplary embodiments of the present invention.

What is claimed is:

1. A reconfigurable discrete time analog signal processor configured to reduce transmit leakage in a simultaneous transmit and receive system, the reconfigurable discrete time analog signal processor comprising:
   a finite impulse response (FIR) filter configured to receive a portion of an RF transmit signal, to receive FIR coefficients, and to generate a cancellation signal based on the portion of the RF transmit signal and the FIR coefficients, the FIR filter comprising:
   a plurality of sample and hold (SH) circuits configured to simultaneously receive the portion of the RF transmit signal, to sample the portion of the RF transmit signal at successive sample times according to a sample clock, and to generate a plurality of sampled analog voltage signals, the portion of the RF transmit signal being a voltage signal; and
   a plurality of programmable analog multipliers coupled to the plurality of SH circuits and configured to multiply the plurality of sampled analog voltage signals by a plurality of binary multiplication factors to generate the cancellation signal, each of the plurality of programmable analog multipliers being a voltage-to-current multiplier.

2. The reconfigurable discrete time analog signal processor of claim 1, wherein the FIR filter further comprises a load controller configured to receive the FIR coefficients and to reconfigure the reconfigurable discrete time analog signal processor by generating the plurality of binary multiplication factors based on the received FIR coefficients.

3. The reconfigurable discrete time analog signal processor of claim 1, further comprising a coefficient calculator configured to generate the FIR coefficients based on the portion of the RF transmit signal, the portion of the RF receive signal, and a portion of the cancellation signal.

4. The reconfigurable discrete time analog signal processor of claim 3, wherein the coefficient calculator is configured to generate the FIR coefficients using an adaptive filtering algorithm.

5. The reconfigurable discrete time analog signal processor of claim 1, wherein each one of the plurality of sampled analog voltage signals have a same duration and are staggered in time.

6. The reconfigurable discrete time analog signal processor of claim 1, wherein the FIR filter further comprises a plurality of coefficient registers configured to supply the plurality of binary multiplication factors to the plurality of programmable analog multipliers, wherein each one of the plurality of coefficient registers comprises the plurality of coefficients.

7. The reconfigurable discrete time analog signal processor of claim 6, wherein each one of the plurality of coefficient registers comprises a rotating shift register configured to store a plurality of coefficients, and to circularly rotate the plurality of coefficients through memory positions of the rotating shift register at each one of the successive sample times.

8. The reconfigurable discrete time analog signal processor of claim 1, wherein the received portion of the RF transmit signal comprises a differential analog signal.

9. The reconfigurable discrete time analog signal processor of claim 1, wherein the generated leakage cancellation signal comprises a differential analog signal.

10. The reconfigurable discrete time analog signal processor of claim 1, wherein the FIR filter further comprises a timing controller configured to generate a plurality of control signals for triggering sample times of the plurality of SH circuits, wherein consecutive ones of the plurality of control signals are offset in time by a sampling period.

11. A system for simultaneous transmit and receive of radio frequency (RF) signals configured to reduce transmit leakage, the system comprising:
   a transmit signal generator configured to generate an RF transmit signal;
   an aperture configured to wirelessly transmit the RF transmit signal and to receive an RF receive signal;
   an analog leakage canceller configured to receive a portion of the RF transmit signal, to receive finite impulse response (FIR) coefficients, and to generate a leakage cancellation signal based on the portion of the RF transmit signal and the FIR coefficients;
   a combiner configured to combine the RF receive signal and the leakage cancellation signal to generate a reduced-noise RF receive signal,
   wherein the leakage canceller comprises:
      a plurality of sample and hold (SH) circuits configured to simultaneously receive the portion of the RF transmit signal, to sample the portion of the RF transmit signal at successive sample times according to a sample clock, and to generate a plurality of sampled analog voltage signals; and
      a plurality of programmable analog multipliers coupled to the plurality of SH circuits and configured to multiply the plurality of sampled analog voltage signals by a plurality of binary multiplication factors to generate the leakage cancellation signal,
   wherein the leakage canceller further comprises a single-input to dual-output (S2D) converter configured to receive the portion of the RF transmit signal and to convert the portion of the RF transmit signal to a balanced differential signal prior to supplying said signal to the plurality of SH circuits, and
   wherein the plurality of SH circuits and the plurality of programmable analog multipliers operate in a differential signal mode.

12. The system of claim 11, further comprising a coefficient calculator configured to generate the FIR coefficients based on the portion of the RF transmit signal, the portion of the RF receive signal, and a portion of the leakage cancellation signal, using adaptive filtering algorithms.

13. The system of claim 11, wherein the leakage canceller further comprises a load controller configured to receive the FIR coefficients and to reconfigure the leakage canceller by generating the plurality of binary multiplication factors based on the received FIR coefficients.

14. The system of claim 11, wherein the transmit signal generator is configured to source an RF signal based on an input data signal to be transmitted, to adjust a phase angle of the RF signal, and to amplify the RF signal using variable gain to generate the RF transmit signal.

15. The system of claim 11, wherein the leakage canceller further comprises a timing controller configured to generate a plurality of control signals for triggering sample times of the plurality of SH circuits, wherein consecutive ones of the plurality of control signals are offset in time by a sampling period.

16. The system of claim 11,
   wherein the leakage canceller further comprises a plurality of coefficient registers configured to supply the plurality of binary multiplication factors to the plurality of programmable analog multipliers, wherein each one of the plurality of coefficient registers comprises the plurality of coefficients, and
   wherein each one of the plurality of coefficient registers comprises a rotating shift register configured to store a plurality of coefficients, and to circularly rotate the plurality of coefficients through memory positions of the rotating shift register at each one of the successive sample times.

17. The system of claim 11, wherein the leakage canceller further comprises a dual-input to single-output (D2S) converter configured to convert a balanced differential output current signal of the plurality of programmable analog multipliers to the leakage cancellation signal, the leakage cancellation signal being an unbalanced non-differential signal.

18. A system for simultaneous transmit and receive of radio frequency (RF) signals configured to reduce transmit leakage, the system comprising:
   a transmit signal generator configured to generate an RF transmit signal;
   an aperture configured to wirelessly transmit the RF transmit signal and to receive an RF receive signal;
   an analog leakage canceller configured to receive a portion of the RF transmit signal, to receive finite impulse response (FIR) coefficients, and to generate a leakage cancellation signal based on the portion of the RF transmit signal and the FIR coefficients;
   a combiner configured to combine the RF receive signal and the leakage cancellation signal to generate a reduced-noise RF receive signal,
   wherein the leakage canceller comprises:
      a plurality of sample and hold (SH) circuits configured to simultaneously receive the portion of the RF transmit signal, to sample the portion of the RF transmit signal at successive sample times according to a sample clock, and to generate a plurality of sampled analog voltage signals; and
      a plurality of programmable analog multipliers coupled to the plurality of SH circuits and configured to multiply the plurality of sampled analog voltage signals by a plurality of binary multiplication factors to generate the leakage cancellation signal,
   wherein the leakage canceller further comprises a track and hold circuit at an input of the plurality of SH circuits, the track and hold circuit being configured to expand an operating bandwidth of the leakage canceller, and
   wherein the track and hold circuit operates at a frequency that is up to a 100 times as high as an operating frequency of the plurality of SH circuits.

* * * * *